United States Patent
Xu

(10) Patent No.: US 6,642,102 B2
(45) Date of Patent: Nov. 4, 2003

(54) BARRIER MATERIAL ENCAPSULATION OF PROGRAMMABLE MATERIAL

(75) Inventor: Daniel Xu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/896,530

(22) Filed: Jun. 30, 2001

(65) Prior Publication Data

US 2003/0003709 A1 Jan. 2, 2003

(51) Int. Cl.[7] .............................................. H01L 21/336
(52) U.S. Cl. ........................ 438/257; 438/396; 438/95; 438/470; 438/128; 257/3; 257/530; 257/621
(58) Field of Search ................................. 438/396, 275, 438/95, 5, 128, 257, 470; 257/3, 75, 621, 520, 530, 594

(56) References Cited

U.S. PATENT DOCUMENTS

| | | | |
|---|---|---|---|
| 4,597,162 A | * | 7/1986 | Johnson et al. ................ 438/16 |
| 5,296,716 A | | 3/1994 | Ovshinsky et al. |
| 5,335,219 A | * | 8/1994 | Ovshinsky et al. ......... 365/113 |
| 5,596,522 A | * | 1/1997 | Ovshinsky et al. ............. 257/3 |
| 5,751,012 A | * | 5/1998 | Wolstenholme et al. ....... 257/2 |
| 5,789,758 A | | 8/1998 | Reinberg |
| 5,879,955 A | | 3/1999 | Gonzalez et al. |
| 5,920,788 A | | 7/1999 | Reinberg |
| 5,933,365 A | * | 8/1999 | Klersy et al. ................ 365/148 |
| 5,970,336 A | | 10/1999 | Wolstenhome et al. |
| 5,998,244 A | | 12/1999 | Wolstenholme et al. |
| 6,002,140 A | | 12/1999 | Gonzalez et al. |
| 6,031,287 A | | 2/2000 | Harshfield |
| 6,087,674 A | | 7/2000 | Ovshinsky et al. |
| 6,114,713 A | * | 9/2000 | Zahorik .......................... 257/4 |
| 6,153,890 A | | 11/2000 | Wolstenholme et al. |
| 6,229,157 B1 | * | 5/2001 | Sandhu ........................ 257/390 |
| 6,287,919 B1 | * | 9/2001 | Zahorik ....................... 438/275 |
| 6,337,266 B1 | * | 1/2002 | Zahorik ....................... 438/618 |
| 6,429,449 B1 | * | 8/2002 | Gomzalez et al. ............. 257/3 |

* cited by examiner

*Primary Examiner*—Matthew Smith
*Assistant Examiner*—V. Yevsikov
(74) *Attorney, Agent, or Firm*—Anthony M. Martinez

(57) ABSTRACT

A method comprising forming as stacked materials on a substrate, a volume of programmable material and a signal line, conformably forming a first dielectric material on the stacked materials, forming a second dielectric material on the first material, etching an opening in the second dielectric material with an etchant that, between the first dielectric material and the second dielectric material, favors removal of the second dielectric material, and forming a contact in the opening to the stacked materials. An apparatus comprising a contact point formed on a substrate, a volume of programmable material formed on the contact point, a signal line formed on the volume of programmable material, a first dielectric material conformally formed on the signal line, a different second dielectric material formed on the first dielectric material, and a contact formed through the first dielectric material and the second dielectric material to the signal line.

13 Claims, 5 Drawing Sheets

BARRIER MATERIAL ENCAPSULATION OF PROGRAMMABLE MATERIAL

BACKGROUND

1. Field

The invention relates generally to programmable devices.

2. Background

Typical memory applications include dynamic random access memory (DRAM), static random access memory (SRAM), erasable programmable read only memory (EPROM), and electrically erasable programmable read only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not use field effect transistor devices, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reset as that value represents a physical state of the material (e.g., crystalline or amorphous). Thus, phase change memory materials represent a significant improvement in non-volatile memory.

One way to form phase change programmable devices such as phase change memory devices is in the form of a stack of programmable material between signal lines (e.g., row and column lines), possibly with an electrode and an isolation device between a signal line and the programmable material. Effective isolation of individual programmable elements (e.g., individual programmable memory elements) is important to improve the performance of a multi-device structure. Thus, what is needed are improved isolation techniques and an apparatus (device structure) with improved device isolation.

DETAILED DESCRIPTION

A method is described. In one embodiment, the method includes forming, as stacked materials on a substrate, a volume of programmable material and a signal line. The method also includes conformably forming a first dielectric material on the stacked materials and form a second dielectric material on the first material. An opening is etched in the second dielectric material with an etchant that, between the first dielectric material and the second dielectric material, favors removal of the second dielectric material. Following the etching of an opening, a contact is formed to the stacked materials.

In another embodiment, an apparatus is described. The apparatus includes a contact point formed on a substrate and a volume of programmable material formed on the contact point. A signal line is formed on the volume of programmable material and a first and second dielectric material overlie the signal line with a contact formed through the first and second dielectric materials to the signal line.

In the following paragraphs in association with the accompanying figures, an example of a memory device and structure (array) is described. The embodiment describes a programmable material including a phase change material wherein the phase of the material determines the state of the memory element (e.g., 0 or 1).

Figure 1:
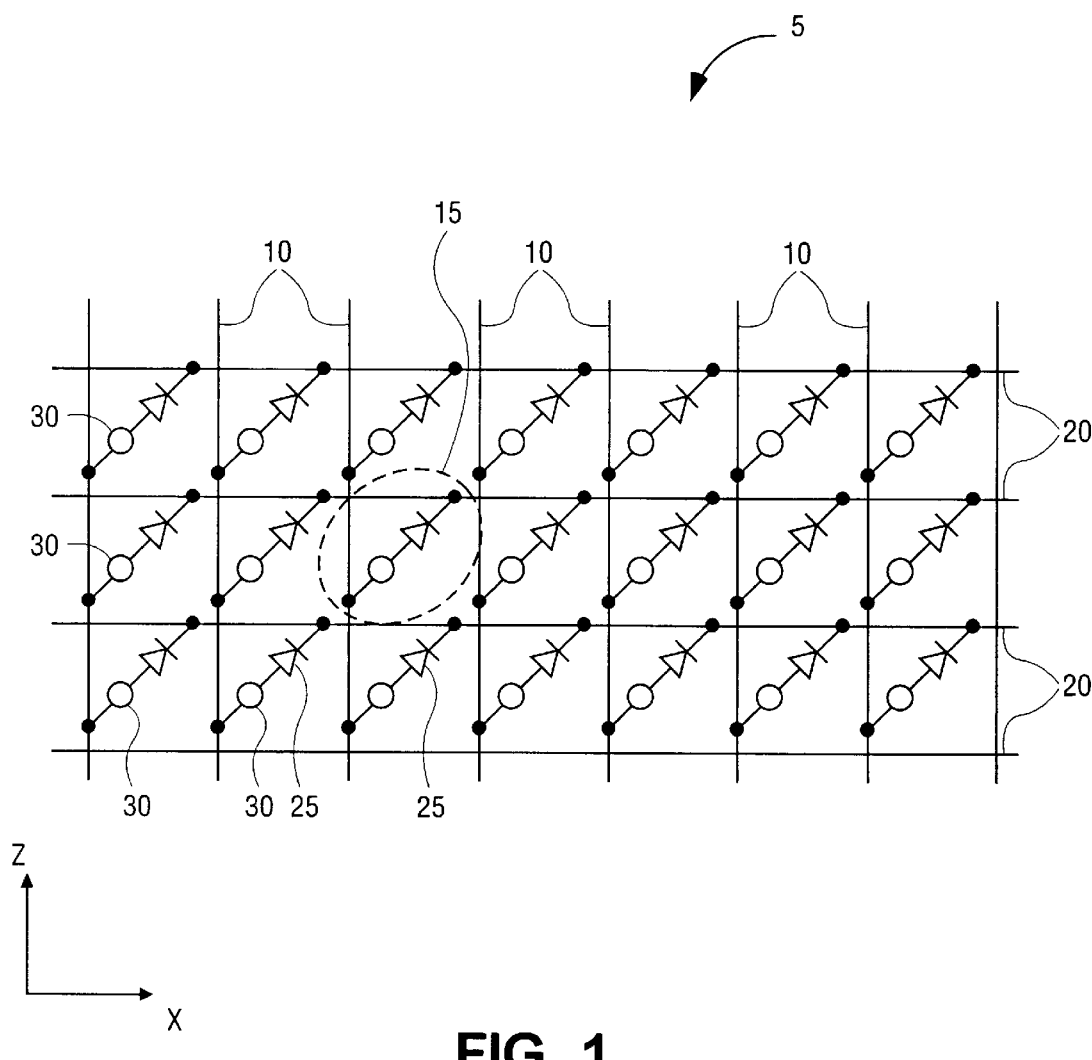
FIG. 1 is a schematic diagram of an array of programmable elements.

FIG. 1 shows a schematic diagram of an embodiment of a memory array comprised of a plurality of memory elements. In this example, the circuit of memory array 5 includes an xz grid with a plurality of memory elements 30 electrically interconnected in series with a plurality of isolation devices 25 on a portion of a chip. Address lines 10 (e.g., columns) and 20 (e.g., rows) are connected, in one embodiment, to external addressing circuitry. One purpose of the xz grid array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer reduced through singulation into discrete die or chips, some or all of the die or chips having a memory array formed thereon.

Additional addressing circuitry (e.g., decoders, etc.) may be formed in a similar fashion.

Figure 2:
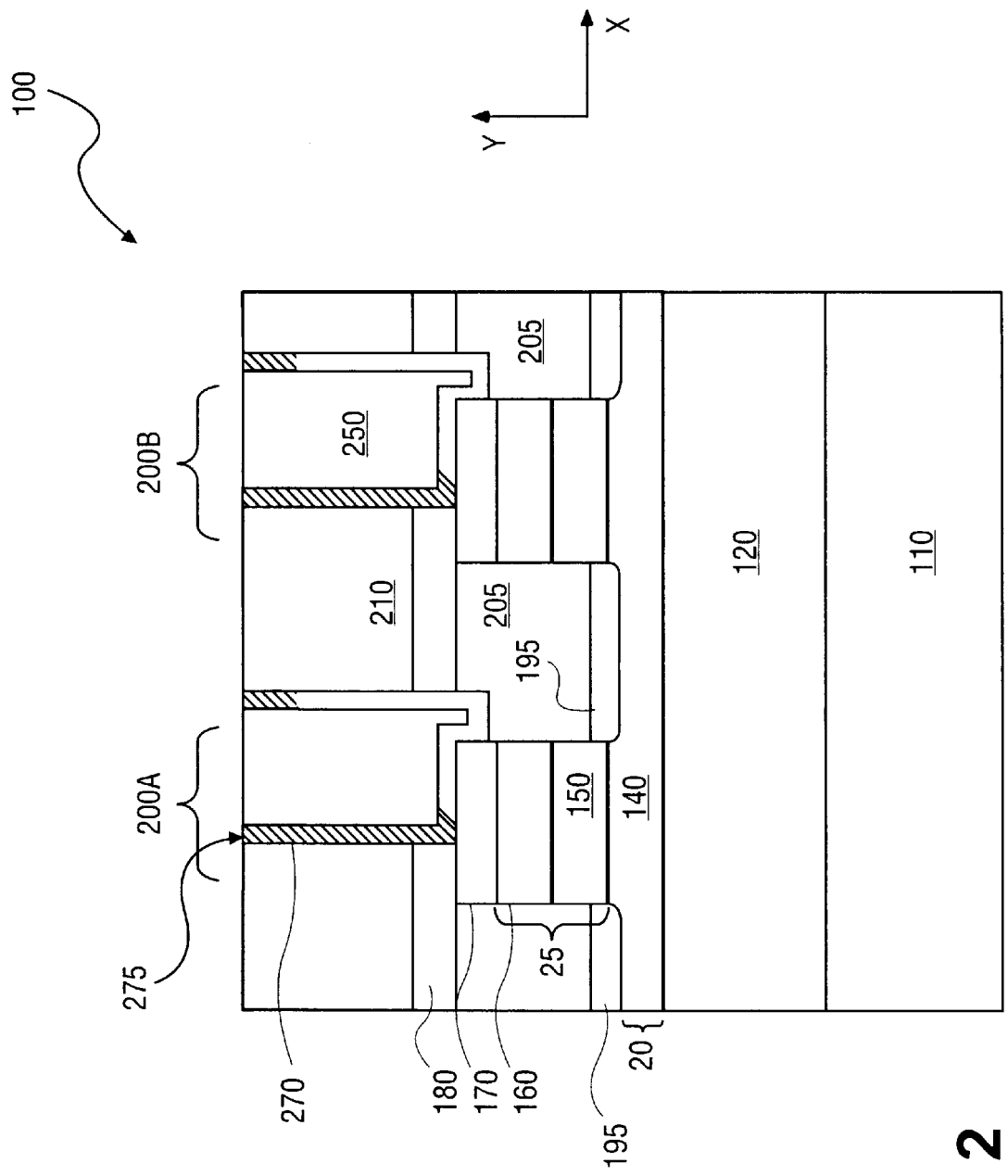
FIG. 2 shows a cross-sectional view of a portion of a semiconductor structure having programmable device cells formed therein, each cell including at this point, an isolation device and an electrode coupled to a signal line.

FIGS. 2–5 illustrate the fabrication of representative memory element 15 of FIG. 1. FIG. 2 shows substrate 110 of structure 100 representatively doped such that substrate 110 includes $P^{++}$ portion (e.g., P-type dopant on the order of $5 \times 10^{19}$ to $1 \times 10^{20}$ atoms per cubic centimeters (atoms/cm$^3$). Overlying $P^{++}$ portion of structure 100, in this example, is portion 120 of P-type epitaxial silicon (e.g., dopant concentration on the order of $10^{16}$ to $10^{17}$ atoms/cm$^3$).

Overlying P-type epitaxial portion 120 in or on substrate 110 of the structure of FIG. 1 is the first conductor signal line material 140. First conductor or signal line material 140, in this example, is N-type doped silicon formed by the introduction of, for example, phosphorous or arsenic to a concentration on the order of about $10^{18}$ to $10^{19}$ atoms/cm$^3$ (e.g., $N^+$ silicon). In this example, first conductor or signal line material 140 serves as an address line, a row line (e.g., row line 20 of FIG. 1).

Device cells 200A and 200B overlie first conductor or signal line material 140. For purposes of this discussion, device cell 200A represents memory element 15 of FIG. 1.

Overlying first conductor or signal line material 140 in each of device cell 200A and device cell 200B is an isolation device (e.g., isolation device 25 of FIG. 1 in device cell 200A). In one example, the isolation device is a PN diode formed of N-type silicon portion 150 (dopant concentration on the order of about $10^{17}$ to $10^{18}$ atoms/cm$^3$) and P-type silicon portion 160 (dopant concentration on the order of about $10^{19}$ to $10^{20}$ atom cm$^3$).

A z-direction dimension (not shown) of device cell 200A and device 200B may be established prior to the formation of first conductor or signal line 140 and isolation device 25. The z-direction dimension may be formed by shallow trench isolation (STI) structures. Following the formation of first conductor or signal line 140 and isolation device 25, the x-direction dimension of device cells 200A and 200B may be formed, again by STI techniques. FIG. 2 shows trenches formed adjacent device cells 200A and 200B. Following trench formation, N-type dopant may be introduced between device cells (e.g., between device cells 200A and 200B) to form pockets 195 having a dopant concentration on the order of about $10^{18}$ to $10^{20}$ atoms/cm$^3$ (e.g., $N^+$ region). FIG. 2 shows dielectric material 205 of, for example, silicon dioxide ($SiO_2$) as STI structures between device cells 200A and 200B.

Referring to FIG. 2, overlying the isolation device (e.g., isolation device 25) in each of device cell 200A and device cell 200B is reducer material 170 of, in this example, a refractory metal silicide such as cobalt silicide ($CoSi_2$). Reducer material 170, in one aspect, serves as a low resistance material in the fabrication of peripheral circuitry (e.g., addressing circuitry) of the circuit structure on the chip in this instance. Thus, reducer material 170 is not required in terms of forming a memory element as described. Nevertheless, because of its generally low resistance property, its inclusion is part of the programmable cell structure between isolation device 25 and a memory element is utilized in this embodiment. Reducer material 170 may be formed by introducing a refractory metal (e.g., cobalt) into a portion of P-type silicon portion 160.

Referring to FIG. 2, dielectric material 180 overlies reducer material 170 and serves, in one embodiment, as an etch stop for a subsequent opening to reducer material 170. Dielectric material 180 is, for example, silicon nitride ($Si_3N_4$).

Dielectric material 210 of, for example, silicon dioxide ($SiO_2$), is introduced over dielectric material 180 to a thickness on the order of 100 angstroms (Å) to 50,000 Å; enough to encapsulate the cell material and to define (possibly after planarization), a y-direction thickness or height of a subsequently introduced electrode. In one embodiment, dielectric material 210 is silicon dioxide ($SiO_2$).

Electrode 270 is formed through dielectric material 210 to reducer material 170. Electrode 270 is formed, for example, by forming an opening through dielectric material 210 to reducer material 170 and lining the opening with electrode material. Dielectric material removed in forming the opening may then be replaced adjacent the electrode along the sidewall of the opening.

A suitable material for electrode 270 includes polycrystalline silicon. Other suitable materials include carbon and semi-metals such as transition metals including, but not limited to, titanium (Ti), titanium-tungsten (TiW), titanium nitride (TiN) and titanium aluminum nitride (TiAlN). Dopants or other agents may be added to electrode 270, for example, at its superior tip (as viewed) to modify the resistance of the electrode material.

As shown in FIG. 2, the superior surface of the structure, in this example, may be planarized, if necessary, such as by chemical-mechanical polish. Following planarization, superior end 275 of electrode 270 is exposed.

Figure 3:
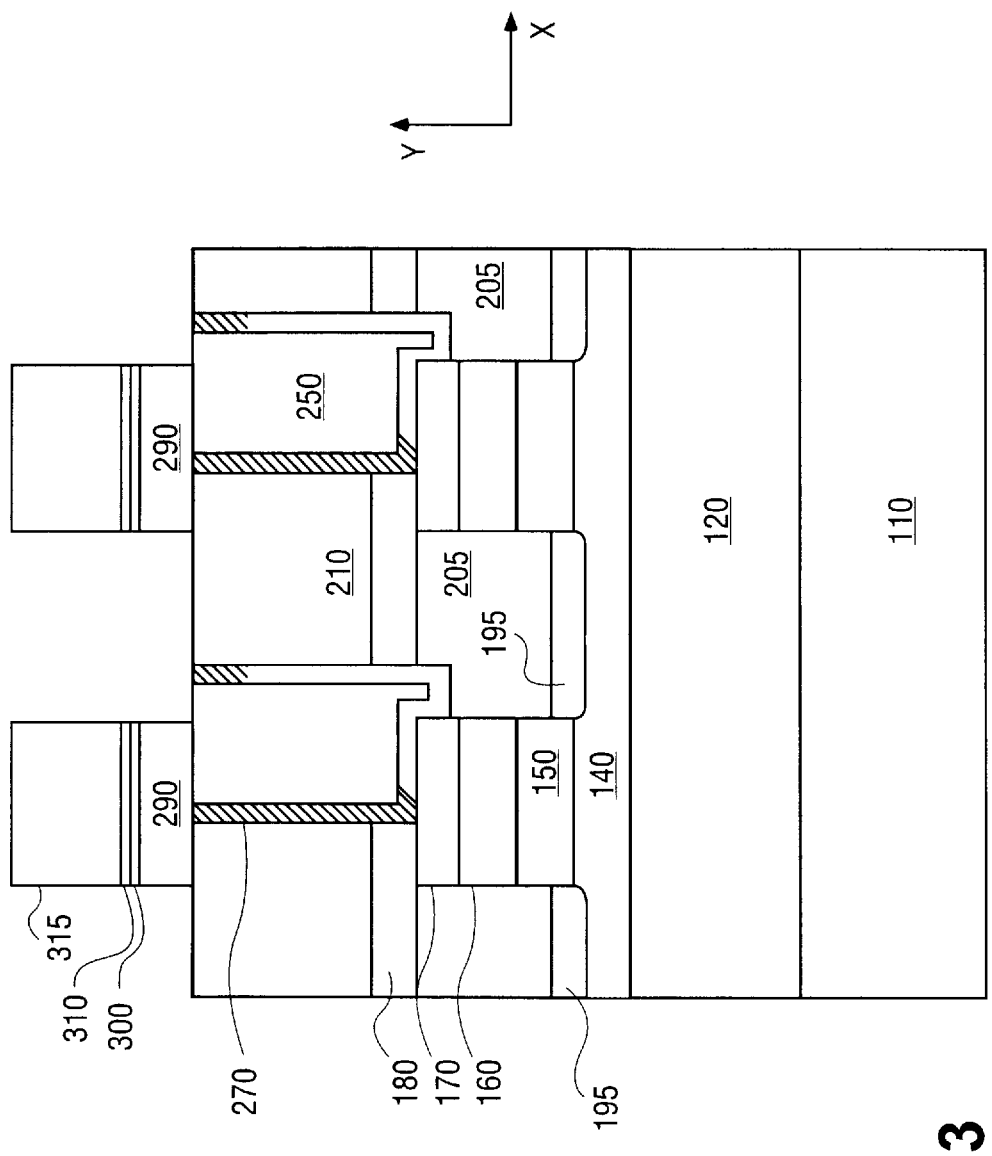
FIG. 3 shows a cross-sectional view of the structure of FIG. 2 further including a programmable material and a second signal line.

FIG. 3 shows the structure of FIG. 2 following the introduction of programmable material 290 in device cells 200A and 200B. In one example, programmable material 290 is a phase change material. In a more specific example, programmable material 290 includes a chalcogenide element(s). Examples of phase change programmable material 290 include, but are not limited to, compositions of the class of tellerium-germanium-antimony ($Te_xGe_ySb_z$) material. Programmable material 290, in one example according to current technology, is introduced to a thickness on the order of about 600 Å.

Overlying programmable material 290 in the structure of FIG. 3 are barrier materials 300 and 310 of, for example, titanium (Ti) and titanium nitride (TiN), respectively. Overlying barrier materials 300 and 310 is second conductor or signal line material 315. In this example, second conductor or signal line material 315 serves as an address line, a column line. Second conductor or signal line material 315 is, for example, an aluminum material, such as an aluminum alloy. As shown in FIG. 3, second conductor or signal line material 315 is patterned to be, in one embodiment, generally orthogonal to first conductor or signal line material 140.

Figure 4:
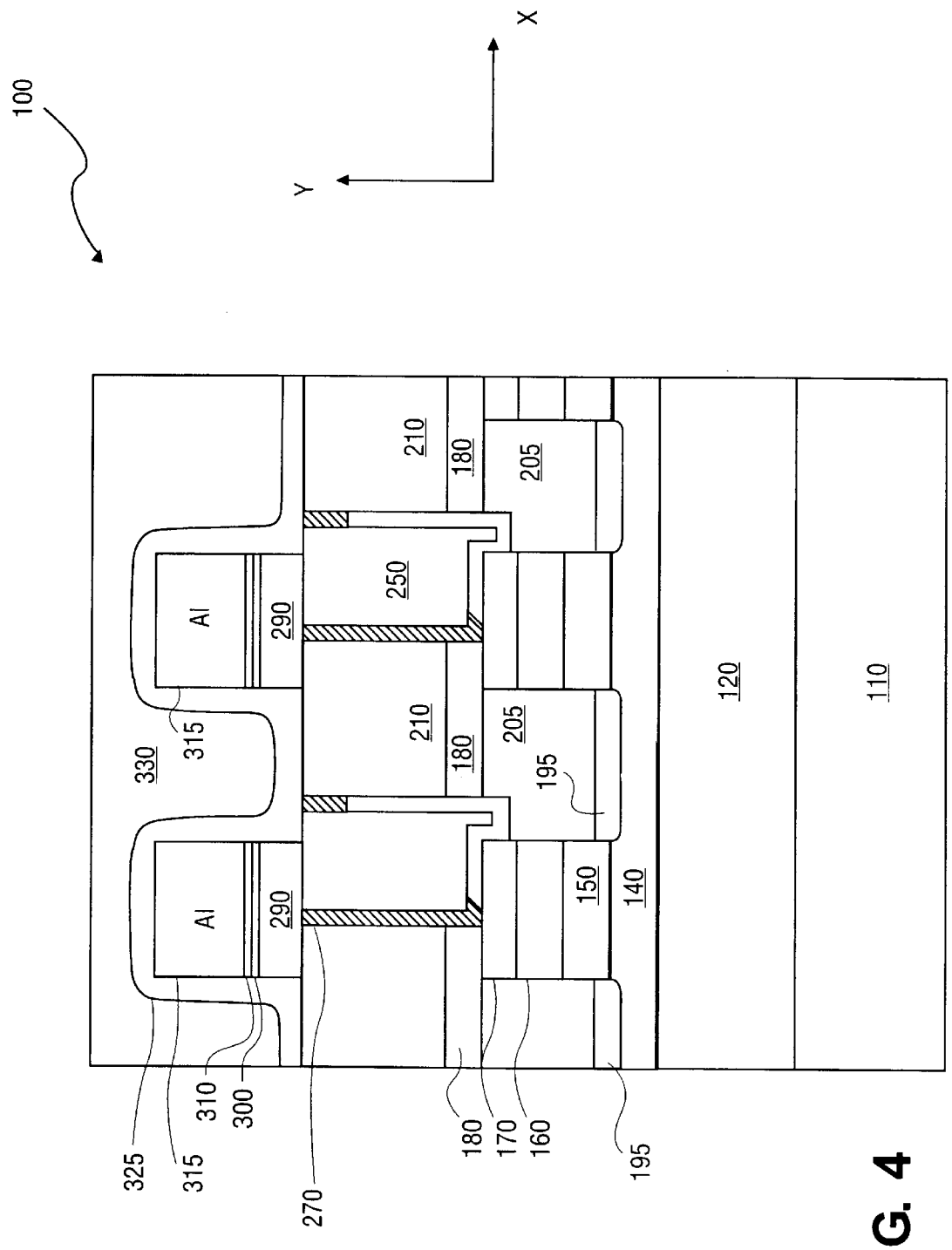
FIG. 4 shows the structure of FIG. 3 following the introduction of a first dielectric layer and a second dielectric layer over the superior surface of the structure.

FIG. 4 shows the structure of FIG. 3 following the introduction of first dielectric material 325. In one embodiment, first dielectric material 325 is conformably introduced over the superior surface (as viewed) of structure 100. First dielectric material is, for example, silicon nitride introduced by chemical vapor deposition (CVD). First dielectric material 325 is introduced to a representative thickness sufficient to encapsulate programmable material 290 between dielectric material 210, first dielectric material 325, and second conductor or signal line material 315 (and barrier materials 300 and 310). First dielectric material 325 may be selected such that it protects programmable material 290 during thermal processing. For example, chalcogenide materials tend to evaporate at thermal processing temperatures greater than 450° C. First dielectric material 325 of, for example, silicon nitride, encapsulates the chalcogenide material (programmable material 290) and inhibits evaporation during subsequent thermal processing of structure 100.

Overlying first dielectric material 325 of structure 100 in FIG. 4 is second dielectric material 330. Second dielectric material is introduced, in one embodiment, to a sufficient thickness to allow for planarization.

Second dielectric material 330 is selected such that, between first dielectric material 325 and second dielectric material 330, second dielectric material 330 may be selectively or favorably removed. In other words, in forming openings through second dielectric material 330, by a process such as etching, the material properties for first dielectric material 325 and second dielectric material 330 are such that an etchant may be selected that favors removal of second dielectric material 330 over first dielectric material 325. Where first dielectric material 325 is silicon nitride ($Si_3N_4$), second dielectric material 330 is for example, silicon dioxide ($SiO_2$).

Figure 5:
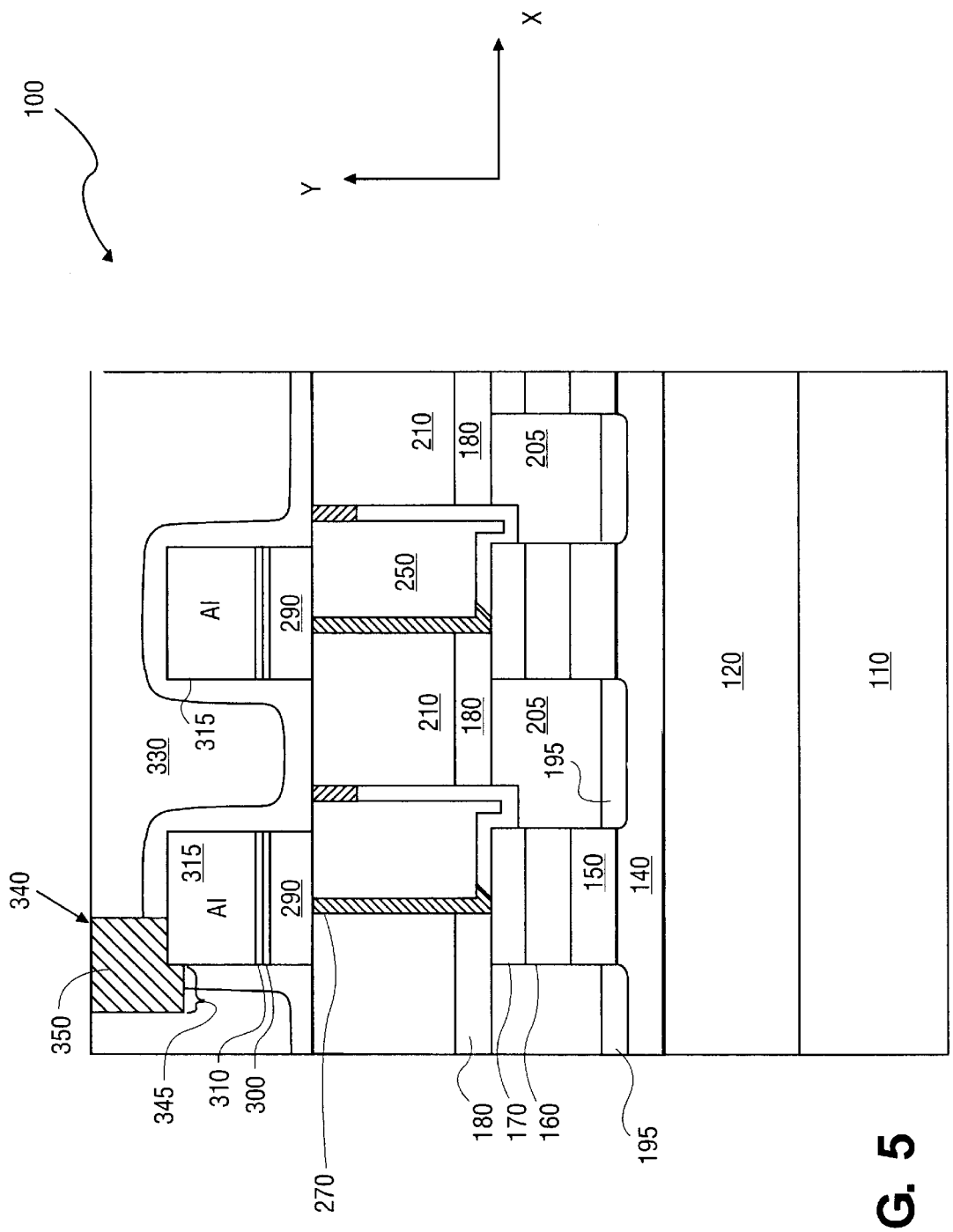
FIG. 5 shows the structure of FIGS. 4 following the forming of a contact to a signal line.

FIG. 5 shows the structure of FIG. 4 following the forming of a contact to second conductor or signal line material 315. Forming a contact to second conductor or signal line material 315 may be desired where, in the example of a memory array, it is desired to couple the signal line (column line) to addressing circuitry.

FIG. 5 shows opening 340 formed in second dielectric material 330. Opening 340 proceeds to second conductor or signal line material 315 and therefore an opening is also made in first dielectric material 325. Contact plug 350 of, for example, tungsten is formed in opening 340.

Referring to forming opening 340, where first dielectric material 325 is silicon nitride and second dielectric material 330 is silicon dioxide, opening 340 may be formed through etch patterning whereby a pattern mask (not shown) defines an opening area for opening 340 and an etchant selectively removes within the opening area. The etchant is selected such that it favors the etching of second dielectric material 330 over first dielectric material 325. In such manner, when the etchant encounters first dielectric material 325, etching stops or is significantly slowed. A suitable etchant where first dielectric material 325 is silicon nitride and second dielectric material 330 is silicon dioxide is, for example, $CF_4/H_2$.

FIG. 5 shows opening 340 misaligned over second conductor or signal line material 315. By including first dielectric material 325 with second dielectric material 330 as a passivation over second conductor or signal line material 315, first dielectric material 325 may act as a barrier layer. Where a selective etchant is used to remove second dielectric material 330 over first dielectric material 325, the barrier layer inhibits the etching or removal of dielectric material to programmable material 290. Thus, to the extent alignment concerns include the possible exposure of programmable material 290, first dielectric material 325 acts as a barrier layer to address this concern.

In the above description, reference to specific embodiments are presented. It will, however, be evident that various modifications and changes may be made thereto without departing from the broader spirit and scope of the invention as set forth in the claims. For example, the representative array of FIG. 1 and the representative programmable device structure(s) of FIGS. 2–5 is one example of an apparatus wherein the programmable material may be encapsulated in passivation layers. It is appreciated, that the passivation technique may be used in other areas where, for example, alignment issues or thermal protection is desired. The specification and drawings are, accordingly, to be regarded in an illustrated rather than a restrictive sense.

What is claimed is:

1. A method comprising:
    forming as stacked materials on a substrate, a volume of programmable material and a signal line;
    conformably forming a first dielectric material on the stacked materials;
    forming a second dielectric material on the first dielectric material;
    etching an opening in the second dielectric material with an etchant that, between the first dielectric material and the second dielectric material, favors removal of the second dielectric material; and
    forming a contact in the opening to the stacked materials.

2. The method of claim 1, further comprising, following etching the second dielectric material, exposing the stacked materials by removing a portion of the first dielectric material in the opening.

3. The method of claim 1, wherein the substrate comprises a surface and a contact point and the volume of programmable material is formed on the contact point, and
    conformably forming the first dielectric material comprises encapsulating the signal line and the volume of programmable material between the surface and the first dielectric material.

4. A method comprising:
    over an electrode formed to a first signal line on a substrate, forming as subsequent patterned layers, a volume of programmable material and a second signal line;
    conformally forming a first dielectric material on the subsequent patterned layers;
    forming a second dielectric material on the first material;
    forming an opening in the second dielectric material that exposes the first dielectric material;
    after forming the opening, exposing the subsequent patterned layers; and
    forming a contact in the opening to the subsequent patterned layers.

5. The method of claim 4, further comprising, wherein forming an opening In the second dielectric material comprises etching, with an etchant that, between the first dielectric material and the second dielectric material, favors removal of the second dielectric material.

6. The method of claim 5, wherein exposing the subsequent patterned layers comprises removing first dielectric material within the opening.

7. The method of claim 6, wherein removing the first dielectric material comprises etching.

8. The method of claim 5, wherein the substrate comprises a surface and a contact point and the volume of programmable material is formed on the contact point, and
    conformally forming the first dielectric material comprises encapsulating the second signal line and the volume of programmable material.

9. A method, comprising:
    forming a stack over a substrate, wherein forming the stack comprises forming a first address line over a phase change material;
    conformally forming a first passivation layer over the stack to encapsulate the stack; and
    forming a second passivation layer over the first passivation layer.

10. The method of claim 9, wherein forming a first address line over a phase change material includes:

forming a chalcogenide material over a surface of the substrate, wherein the chalcogenide material forms the phase change material; and forming a layer comprised of aluminum over the chalcogenide material, wherein the layer comprised of aluminum forms the first address line.

11. The method of claim 19, further comprising selectively removing a portion of the second passivation layer by using a selective etchant that removes the second passivation layer and when the selective etchant encounters the first passivation layer, etching stops or is significantly slowed.

12. The method of claim 9, further comprising forming a second address line in the substrate, wherein the first address line is substantially orthogonal to the second address line.

13. The method of claim 9, wherein conformally forming a first passivation layer includes conformally forming a first passivation layer over the stack to encapsulate the stack to protect the stack during subsequent etching or thermal processing.

* * * * *